United States Patent [19]
Rowland

[11] Patent Number: 5,376,431
[45] Date of Patent: Dec. 27, 1994

[54] RETROREFLECTIVE MICROPRISM SHEETING WITH SILVER/COPPER REFLECTING COATING AND METHOD OF MAKING SAME

[75] Inventor: William P. Rowland, Southington, Conn.

[73] Assignee: Reflexite Corporation, Avon, Conn.

[21] Appl. No.: 61,482

[22] Filed: May 12, 1993

[51] Int. Cl.$^5$ .............. B32B 3/00; B05D 5/06
[52] U.S. Cl. .................. 428/164; 428/141; 428/142; 428/156; 428/161; 428/163; 428/192; 428/215; 428/333; 428/913; 428/172; 428/908.8; 428/912.2; 427/162; 427/166; 427/168; 427/404; 359/536; 359/542; 359/546; 359/585; 359/833
[58] Field of Search .............. 428/156, 172, 167, 141, 428/142, 161, 164, 192, 215, 209, 333, 908.8, 912.2, 913; 427/162, 163, 166, 168, 404; 359/321, 536, 542, 546, 585, 837

[56] References Cited

U.S. PATENT DOCUMENTS

| | | | |
|---|---|---|---|
| 184,632 | 11/1976 | Laval | 427/169 |
| 1,890,094 | 12/1932 | Peacock | 428/328 |
| 1,935,520 | 11/1933 | Peacock | 427/165 |
| 2,183,202 | 12/1939 | Misciattelli | 427/165 |
| 2,190,121 | 2/1940 | Misciattelli | 427/165 |
| 2,614,943 | 10/1952 | Franza | 427/165 |
| 2,664,363 | 12/1953 | Meth | 427/160 |
| 2,759,845 | 8/1956 | Hilemn | 427/162 |
| 2,801,935 | 8/1957 | Owen | 427/169 |
| 2,915,414 | 12/1959 | Hilemn | 427/168 |
| 2,977,244 | 3/1961 | Kay et al. | 427/168 |
| 3,069,289 | 12/1962 | Bryant | 427/162 |
| 3,457,138 | 7/1969 | Miller | 428/34 |
| 3,687,713 | 8/1972 | Adams | 428/623 |
| 3,900,601 | 8/1975 | Franz et al. | 427/108 |
| 3,920,864 | 11/1975 | Greenberg et al. | 427/169 |
| 3,993,845 | 11/1976 | Greenberg et al. | 428/433 |
| 4,035,527 | 7/1977 | Deeg | 427/169 |
| 4,285,992 | 8/1981 | Buckwalter, Jr. | 427/165 |
| 4,357,396 | 11/1982 | Grunewalder et al. | 428/34 |
| 4,482,209 | 11/1984 | Grewal et al. | 359/283 |
| 4,724,164 | 2/1988 | Columbare et al. | 427/165 |
| 4,801,193 | 1/1989 | Martin | 359/518 |
| 4,880,668 | 11/1989 | Hayes et al. | 427/162 |
| 4,894,278 | 1/1990 | Servais et al. | 428/201 |

Primary Examiner—Donald J. Loney

[57] ABSTRACT

Retroreflective sheet material is produced by forming sheet material with closely spaced retroreflective formations on one face and depositing on this face silver and copper atoms having high kinetic energy to provide a reflective metallic deposit comprising a base layer of metallic silver and an overlying layer of metallic copper. An organic protective coating is thereafter applied over the reflective metallic deposit. Light rays passing through the front face of the body enter the retroreflective formations, impinge upon the interface provided by the silver base layer and are retroreflected therefrom. As a result, the sheet material exhibits a bright white appearance in daylight as well as a bright white coloration at night when an incandescent beam impinges thereon.

17 Claims, 2 Drawing Sheets

RETROREFLECTIVE MICROPRISM SHEETING WITH SILVER/COPPER REFLECTING COATING AND METHOD OF MAKING SAME

BACKGROUND OF THE INVENTION

The present invention relates to retroreflective sheeting and, more particularly, to such sheeting which is provided with a metallic deposit to reflect light rays impinging upon the reflective surfaces.

Retroreflective sheeting is now widely employed for many safety and other applications. This sheeting most commonly used employs glass spheres, and molded or embossed spherical or prism formations to redirect the light rays. Although an air interface about these formations will provide a reflective surface for light rays entering the formations, commonly the reflective formations are provided with a reflective coating such as a metallic deposit.

Although molded glass and plastic macroprism surfaces have long been used for reflectors, relatively flexible plastic sheeting with microprisms have been widely adopted for many applications.

The microprisms are closely spaced and can be described as cube corner formations. Further details concerning the structure and operation of such microprisms may be found in Rowland U.S. Pat. No. 3,684,348 granted Aug. 15, 1972. These microprisms or cube corner formations may have a side edge dimension of up to 0.025 inch, but the preferred structures use edge dimensions of not more than 0.010 inch, and most desirably on the order of 0.004-0.008 inch. The base film of the sheeting will generally have a thickness on the order of 0.001-0.30 inch and preferably about 0.002-0.010 inch depending upon the method of fabrication, the resins, and the characteristics desired for the retroreflective sheeting.

Metallized aluminum has been widely utilized to provide the reflective interface on microprisms and microspheres, but these aluminum coated materials tend to appear grey in daylight.

Although a silver deposit was found to provide a white appearance in ambient light, such a deposit was found highly susceptible to corrosion, particularly in a salt atmosphere, and the sheeting turned grey to black in appearance over a period of exposure and failed to retroreflect light. Various types of protective organic coatings failed to overcome this corrosion problem, rendering silver coated materials unsuitable for general applications.

Another approach to eliminating greyness of the appearance which has been successfully utilized is that described in Martin U.S. Pat. No. 4,801,193 in which the microprisms are partially metallized and partially air backed. However, this involves relatively complex coating procedures.

An effective process for making the microprism sheeting is described in the Rowland U.S. Pat. No. 3,689,346 granted Sep. 5, 1972 in which the cube corner formations are cast in a cooperatively configured mold and are bonded to a base film which is applied thereover to provide a composite structure in which the cube corner formations project from the one surface of the sheeting.

Another method for fabricating such microprism sheeting is shown in Rowland U.S. Pat. No. 4,244,683 granted Jan. 13, 1981 in which the cube corner formations are produced by embossing a length of sheeting in suitable embossing apparatus with precisely formed molds in a manner which avoids entrapment of air.

It is an object of the present invention to provide a novel method for making retroreflective sheet material with a reflective metallic deposit providing a bright white appearance in daylight and which is well bonded to the underlying microprisms.

It is also an object to provide such a method for making retroreflective sheet material in which the material exhibits good retroreflective properties and is resistant to corrosion in a salt atmosphere.

Another object is to provide such a method for making such sheet material which may be effected rapidly and relatively simply.

SUMMARY OF THE INVENTION

It has now been found that the foregoing and related objects may be readily attained by a method in which sheet material is formed with a transparent body having a planar front face and a multiplicity of closely spaced retroreflective formations on the other face thereof. Initially formed on the surface of the sheet material having the retroreflective formation is a reflective metallic deposit comprising a base layer of metallic silver and an overlying layer of metallic copper. The silver and copper layers are deposited in a vacuum as metallic atoms with high kinetic energy. Thereafter, there is applied over the reflective metallic deposit an organic protective coating.

As a result, light rays passing through the front face of the body enter the retroreflective formations and impinge upon the silver base layer on the formations and are retroreflected therefrom. A bright white appearance is exhibited in daylight, and a bright white coloration is also provided at night when a beam of incandescent light impinges upon the front face of the sheet material.

Preferably, the retroreflective formations are closely spaced microprisms having a side edge dimension of not more than 0.015 inch, and desirably they are of cube corner configuration. The microprisms are formed by molding a fluid synthetic resin against a synthetic resin carrier film, providing the body portion and the fluid synthetic resin is desirably a polymerizable or crosslinkable urethane, epoxy, silicone or polyester resin formulation.

The step of forming the metallic deposit utilizes high energy sputter coating techniques to produce the high energy metallic silver and copper atoms. This produces good adhesion of the silver layer to the surface of the synthetic resin. It is also believed that the method of forming the metallic deposit produces an intermetallic interface comprised of both metals.

Desirably, the step of applying an organic protective coating includes the application of a synthetic resin adhesive upon the metallic deposit, and a synthetic resin film is bonded thereto.

Generally, the silver base layer will have a thickness of 300-5000 Angstroms and preferably 600-2000 Angstroms. The copper layer will normally have a thickness of at least 200 Angstroms and preferably about 400-2500 Angstroms.

DETAILED DESCRIPTION OF THE PREFERRED EMBODIMENT

Figure 2:
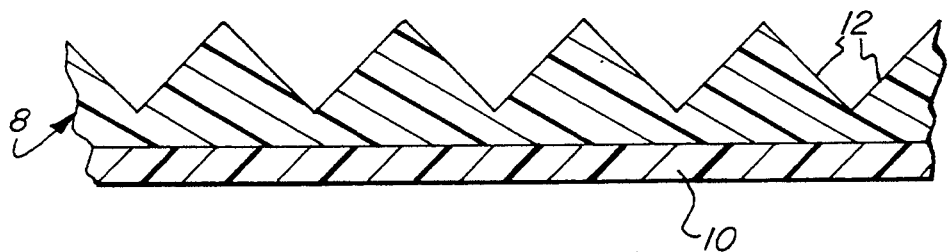
FIG. 2 is a fragmentary sectional view to a greatly enlarged scale of the sheet material prior to the deposition of the metallic deposit.

Turning first to FIG. 2, therein fragmentarily illustrated is microprism sheeting of the type which is employed in the present invention and which is generally designated by the numeral 8. The sheeting 8 is conveniently formed by casting a resin formulation to form closely spaced microprisms 12 on a base film 10 as described in the aforementioned Rowland Patents.

Figure 3:
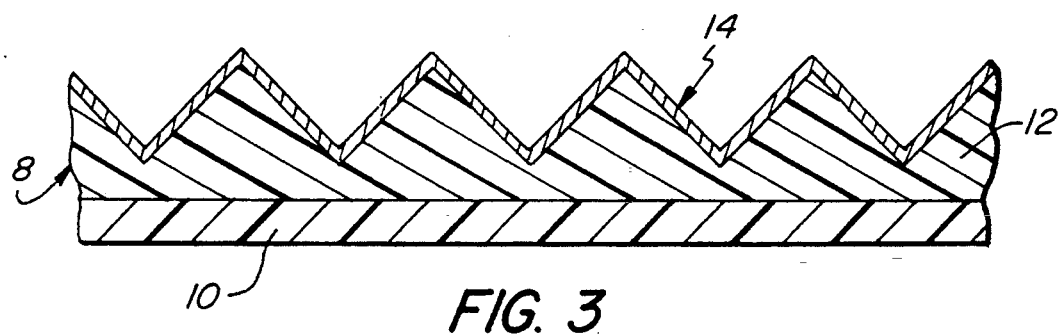
FIG. 3 is a similar view of the sheet material after deposition of the metallic deposit which is exaggerated in thickness.
Figure 4:
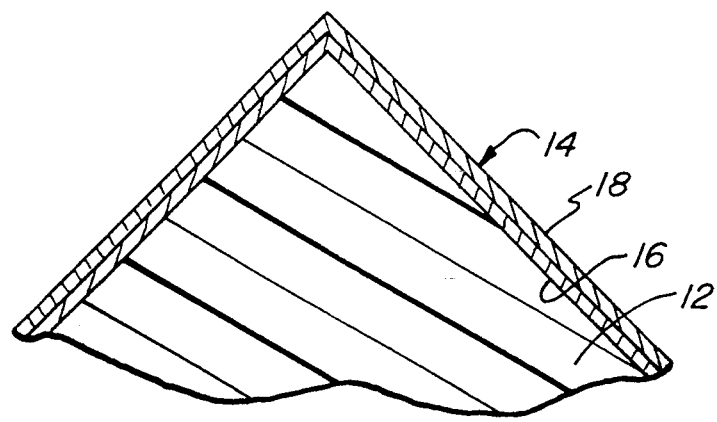
FIG. 4 is an enlarged sectional view of a microprism with the thickness of the deposit exaggerated to show the silver and copper layers of the deposit.

As illustrated in FIG. 3, the sheeting 8 of FIG. 2 is shown with a reflective metallic deposit generally designated by the numeral 14. This is comprised of a base layer 16 of silver and superposed layer 18 of copper as seen in FIG. 4. Thereafter, an adhesive or other coating material 20 may be deposited thereon, as seen in FIG. 5.

Figure 1:
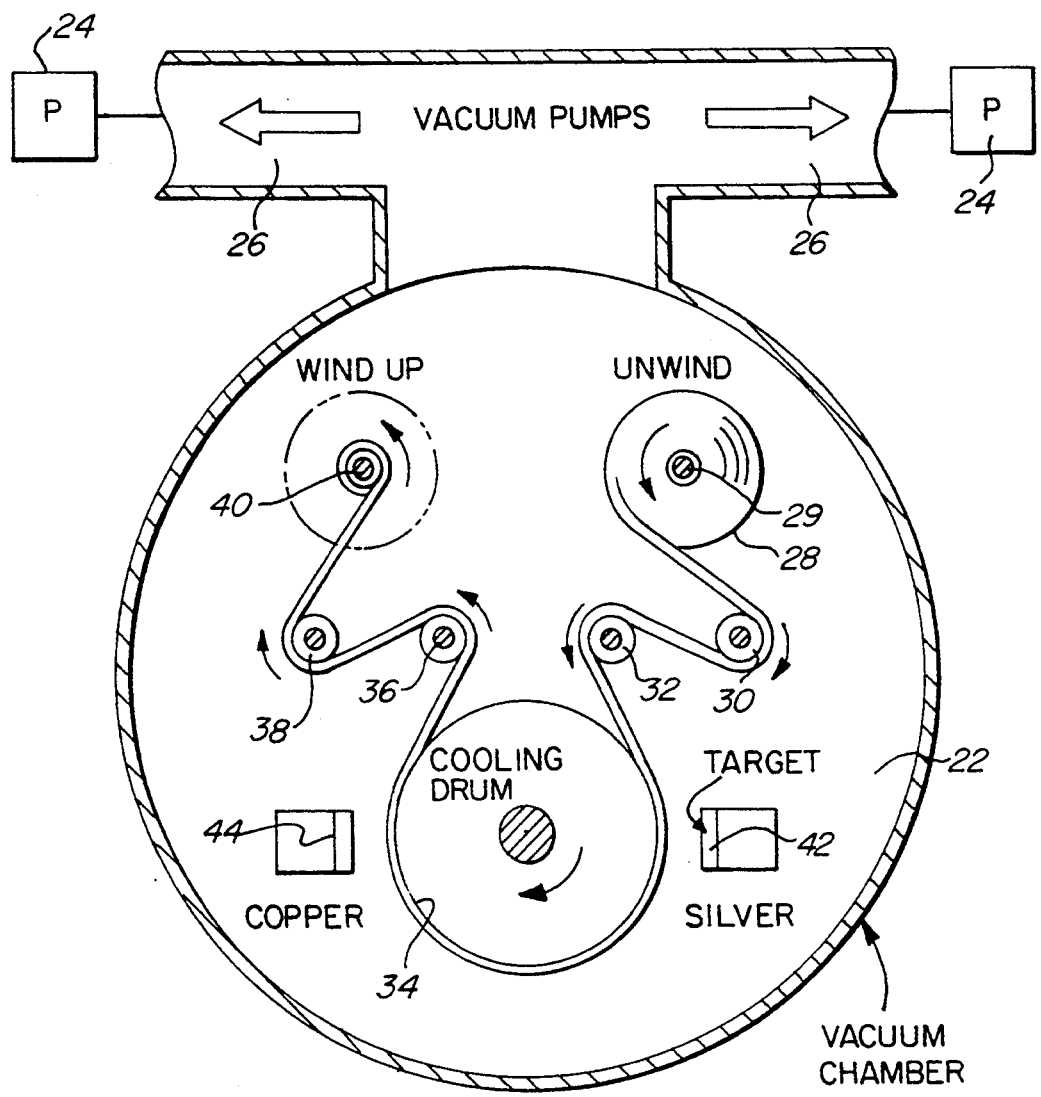
FIG. 1 is a diagrammatic illustration of vacuum sputtering apparatus for producing the silver/copper metallic deposit on the microprisms.

Turning now to FIG. 1, the apparatus to develop the metallic deposit 14 is illustrated schematically as comprising a vacuum chamber 22 connected to vacuum pumps 24 by the conduits 26. A roll 28 of the microprism sheeting 8 seen in FIG. 2 is supported therein on the roll shaft 29, and the sheeting 8 passes about tensioning rolls 30, 32 and thence about the cooling drum 34. From the drum 34, it passes about the tensioning rolls 36, 38 and is coiled on the roll shaft 40 which is being driven. The direction of motion of the sheeting can be reversed since both the shafts 29 and 40 can be driven.

Figure 5:
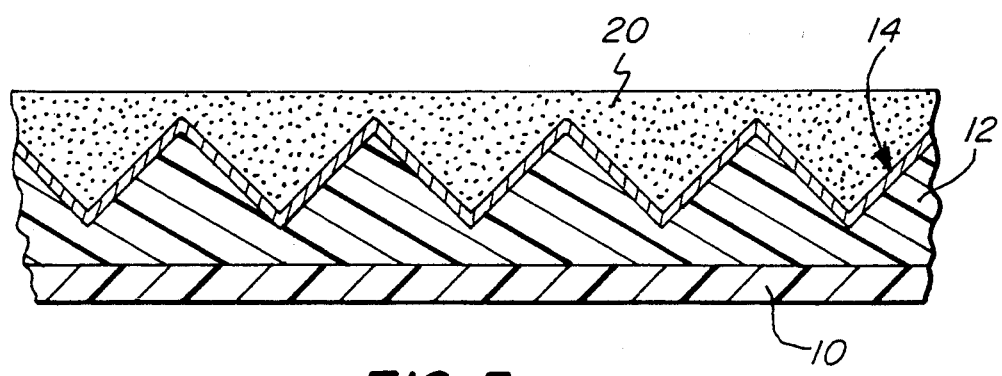
FIG. 5 is a fragmentary sectional view of the sheet material with a protective organic adhesive coating on the metallic deposit formed on the microprism surface.

As the sheeting 8 passes about the cooling drum 34, it is exposed to sputtered metal from the silver cathode 42 and then the copper cathode 44 which form the composite metallic deposit 14 seen in FIGS. 3–5. After the sheeting 8 has been metallized in one or more passes, the vacuum in the chamber 22 can be broken, and the roll 28 of now metallized sheeting 8 can be removed.

Subsequently, the sheeting 8 may be coated with an adhesive or other coating and a protective sheet material backing provided thereon as is conventional.

The thickness of the silver and copper layers may vary. Generally, however, the silver layer should be at least 300 Angstroms and may be as thick as 5000 Angstroms or even thicker if so desired, but at greater cost. However, thicknesses of about 600–2000 Angstroms exhibit a high degree of reflectivity and are easily obtained, albeit in multiple passes. Moreover, thicknesses in this range appear to form an intermetallic layer with the copper layer being deposited thereon, possibly as the result of diffusion or concurrent deposition.

A copper layer of as little as 200 Angstroms will provide the desired composite coating but thicknesses on the order of 400–2500 Angstroms are preferred and provide the opportunity to form an intermetallic layer as well as a good protective layer for the underlying silver layer.

The process employed for the deposition of the composite metallic deposit is one in which the metal is sputtered in a vacuum by high energy inert gas ions striking a target of the metal. As the gas ions strike the target metal with energies in the range of 100–1000 electron volts, the metal at the surface of the target is evaporated to form a vapor of atoms having energy in the range of 10–50 electron volts and the metal deposits on the surface of the sheeting as it passes by the target. Such high energy sputtering processes are described by John A. Thornton in "Coating Deposition By Sputtering" in *Deposition Technologies For Films And Coatings*, published in Noyes Publications of Park Ridge, N.J., in 1982.

Using a DC sputtering technique of the type described in this reference, the vacuum drawn in the vacuum chamber is typically $5 \times 10^{-4} - 5 \times 10^{-7}$ Torr with a pressure of argon or other inert gas of 1–100 mTorr. The target voltage may be within the range of 1000–5000 volts and the target current in the range of 5–25 amperes with the target power being in the range of 5–15 kilowatts.

Because it is difficult to measure the thickness of the metal deposits on the angled surfaces of the prisms, two techniques may be employed to determine appropriate conditions for the silver deposit. In one technique the optical density of the unmetallized and metallized sheeting is measured. The silver deposit should provide an increase of 2.0–2.5 in density. Another technique is to place a flat glass slide adjacent the roll and to one side of the sheeting in the path of the metal atoms moving from the target toward the sheeting. The thickness of the metal deposited on the surface of the flat slide may be readily measured.

Typically, the linear speed of the sheeting will be varied to control the thickness of the deposit, but it must be sufficient to avoid overheating of the resin sheeting which would cause softening and even melting. To obtain a desired thickness for the deposit, two or more passes may be required, and generally a circumferential or lineal speed of 20–40 feet per minute is desirable.

The distance from the metal targets to the surface of the sheeting is generally within the range of 1–3 inches.

By having the copper deposited closely following the point of the silver deposit, it is believed that the high energy copper atoms initially form an intermetallic layer with the surface portion of the silver and that this intermetallic layer provides the high degree of corrosion resistance. Samples of retroreflective sheeting with only a silver deposit and the protective coating thereover corrode inwardly from the edges of the sheeting.

Preferably, the sheeting passes about a water cooled drum to extract from the sheeting the heat resulting from the deposition of the hot atoms of the vaporized metal. As is known, the size of the target and the energy of the electrons impinging thereon will also affect the thickness of the deposit. The target should be of greater width than the sheeting to ensure a uniform deposit adjacent the edges.

The nature of the protective synthetic resin placed over the metallic deposit may vary, but it should be resistant to passage of polar substances. If a backing member is to be placed thereover, it is conveniently an adhesive which will bond a synthetic resin sheet material thereto to provide a laminate. It may also be a thermoplastic material which may be heated to render it tacky to provide adhesion to the surface. The coating itself may serve as the final backing or it may serve as the means for adhering the reflective sheeting to a substrate by use of an ever-tacky pressure sensitive adhesive and placing a release paper or film thereover.

However, for most applications, a protective sheeting of synthetic plastic sheet material will be bonded to the synthetic resin coating. This in turn may be provided with a pressure sensitive adhesive coating and a release film or paper thereon.

Exemplary of the present invention are the following specific examples.

EXAMPLE ONE

A microprism sheeting of the type seen in FIG. 2 is produced by casting an UV-curing acrylic-modified polyester resin formulation into microprism cavities of a mold surface, pressing a polyester film of 0.002 inch thickness thereagainst and curing the polyester resin by ultraviolet light. The resultant microprisms have a height of about 0.0028 inch and center to center spacing of 0.006 inch.

A roll of the resultant sheeting on 18 inches width is placed in a vacuum apparatus of the type illustrated in FIG. 1, and the microprism surface is provided with a sputter coating of silver in three passes by a silver target at a linear speed of 30 feet per minute. The silver target is 24 inches long and is spaced $2\frac{1}{8}$ inches from the sheeting. The argon pressure is 10–12 mTorr and the flow rate is 65–70 cubic centimeters per minute; the vacuum is $6 \times 10^{-6}$ Torr.

In the last pass by the silver target, power is also applied to the copper target, which is spaced 1 11/16 inches from the sheeting. The power applied to both targets is 10 kilowatts, and the amperage is 15–18.

The now metallized sheeting is removed from the vacuum chamber and a section is examined. The sheeting as viewed through the planar face is bright white; the microprism face has a golden color. An adhesive strip applied to the metallic deposit does not lift the deposit.

Next, a coating of a silicone pressure sensitive adhesive marketed by Dow Chemical Company is applied to the surface to a thickness of about 0.002 inch above the apices of the prisms.

Specimens immersed in four percent sodium chloride solution show no signs of discoloration after seven weeks.

Specimens subjected to accelerated weathering in a carbon arc weatherometer show no signs of corrosion after 1000 hours of exposure.

It is also observed that the sheeting provides greater retroreflection at increasing angles of incidence as compared to an aluminum metallized equivalent product. The daytime luminance represented by the tri-stimulus co-ordinate CAPY is increased to a value of 27 as compared to Al metallized sheeting with a CAPY value of 11 photometric measurements at 0.2° observation angle and −4° entrance angle produce values in excess of 1300 CD/LX/M².

Samples of sheeting exposed to an outdoor atmosphere for 12 weeks exhibit no signs of corrosion of the metallic deposit.

EXAMPLE TWO

Sheeting is prepared substantially in the manner described in Example One except that the coating of silicone resin is stopped short of the edges to leave exposed portions of the metal deposit along the sides of the sheeting. Specimens of this material placed in a salt solution begin to turn black in the uncoated areas within 24 hours, but corrosion does not proceed under the coated portion of the sheeting.

Thus, it can be seen from the foregoing detailed specification that the method of the present invention provides retroreflective sheeting which exhibits a bright white daylight appearance and which is highly resistant to corrosion in salt atmosphere. The metallic deposit is well bonded to the microprism surface and provides high retroreflectivity when exposed to a beam of incandescent light at night.

I claim:

1. In the method for producing retroreflective sheet material, the steps comprising:
   (a) forming sheet material with a transparent body and having a planar front face and a multiplicity of closely spaced retroreflective formations selected from the group consisting of prisms and spheres on the other face thereof;
   (b) forming on said other face a reflective metallic deposit comprising a base layer of metallic silver and an overlying layer of metallic copper, said silver and copper layers being deposited in a vacuum as metallic atoms with high kinetic energy to effect firm bonding to said other face; and
   (c) applying over said reflective metallic deposit an organic protective coating, whereby light rays passing through said front face of said body enter said retroreflective formations and impinge upon said silver base layer and are reflected therefrom, said sheet material evidencing a bright white appearance in daylight and a bright white coloration at night when impinged upon by a beam of incandescent light.

2. The method of making retroreflective sheet material in accordance with claim 1 wherein said silver base layer has a thickness of 300–5000 Angstroms and said copper layer has a thickness of at least 200 Angstroms.

3. The method of making retroreflective sheet material in accordance with claim 1 wherein said retroreflective formations are microprisms having a side edge dimension of not more than 0.015 inch.

4. The method of making retroreflective sheet material in accordance with claim 1 wherein said microprisms are of cube corner configuration.

5. The method of making retroreflective sheet material in accordance with claim 4 wherein said microprisms are formed by molding a fluid synthetic resin against a synthetic resin carrier film providing said body.

6. The method of making retroreflective sheet material in accordance with claim 5 wherein said fluid synthetic resin is selected from the group consisting of urethane, epoxy, silicone and polyester resin formulations.

7. The method of making retroreflective sheet material in accordance with claim 1 wherein said metallic atoms are produced by high energy sputter coating techniques.

8. The method of making retroreflective sheet material in accordance with claim 7 wherein said step of forming said metallic deposit produces firm adhesion of said silver layer to said other surface of said sheet material.

9. The method of making retroreflective sheet material in accordance with claim 1 wherein said step of forming said metallic deposit includes formation of an intermetallic interface comprised of silver and copper.

10. The method of making retroreflective sheet material in accordance with claim 1 wherein said step of applying an organic protective coating includes the application of a synthetic resin adhesive upon said metallic deposit and bonding a synthetic resin film thereto.

11. A retroreflective sheet material comprising:
(a) retroreflective sheeting having a planar front face and a rear face with closely spaced retroreflective formations thereon selected from the group consisting of prisms and spheres;
(b) a reflective metallic deposit on said rear face including a base layer of silver metal and an overlying Layer of copper, said deposit being firmly bonded to said sheeting; and
(c) an organic protective coating on said metallic deposit, whereby light rays entering said front face and passing into said retroreflective formations impinge upon said silver base layer on said retroreflective formations are retroreflected thereby, said sheet material evidencing a bright white appearance in daylight, and a bright white coloration at night when impinged upon by a beam of incandescent light.

12. The retroreflective sheeting in accordance with claim wherein said silver base layer has a thickness of 300–5000 Angstroms and said copper layer has a thickness of at least 200 Angstroms.

13. The retroreflective sheeting in accordance with claim 11 wherein said retroreflective formations are microprisms having a side edge dimension of not more than 0.015 inch.

14. The retroreflective sheeting in accordance with claim 10 wherein said microprisms are of cube corner configuration.

15. The retroreflective sheeting in accordance with claim 13 wherein said microprisms are formed of a first synthetic resin and said body is formed of a second synthetic resin.

16. The retroreflective sheeting in accordance with claim 11 wherein said deposit includes an intermetallic interface of silver and copper.

17. The retroreflective sheeting in accordance with claim 11 wherein said protective coating includes a layer of an adhesive on said other face and a synthetic resin film bonded thereto.

* * * * *

UNITED STATES PATENT AND TRADEMARK OFFICE
CERTIFICATE OF CORRECTION

PATENT NO. : 5,376,431
DATED : December 27, 1994
INVENTOR(S) : William P. Rowland It is certified that error appears in the above-indentified patent and that said Letters Patent is hereby corrected as shown below:

Column 7, line 22, after "claim" insert --11--.

Signed and Sealed this

Third Day of October, 1995

Attest:

BRUCE LEHMAN

Attesting Officer

Commissioner of Patents and Trademarks